(12) United States Patent
Goldberg et al.

(10) Patent No.: US 6,788,445 B2
(45) Date of Patent: Sep. 7, 2004

(54) MULTI-BEAM POLYGON SCANNING SYSTEM

(75) Inventors: Boris Goldberg, Ashod (IL); Silviu Reinhorn, Mevaseret-Zion (IL)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/043,274

(22) Filed: Jan. 14, 2002

(65) Prior Publication Data

US 2003/0184835 A1 Oct. 2, 2003

(51) Int. Cl.[7] .................................................. G02B 26/08
(52) U.S. Cl. ...................................... 359/204; 347/250
(58) Field of Search .......................... 347/250; 359/202, 359/204, 212, 216

(56) References Cited

U.S. PATENT DOCUMENTS

| 4,040,096 A | | 8/1977 | Starkweather |
| 4,213,157 A | | 7/1980 | DeBenedictis et al. |
| 5,043,744 A | * | 8/1991 | Fantuzzo et al. ............ 347/250 |
| 6,317,246 B1 | * | 11/2001 | Hayashi et al. ............. 359/204 |
| 6,351,324 B1 | * | 2/2002 | Flint ............................ 359/202 |
| 6,606,180 B2 | * | 8/2003 | Harada ........................ 359/204 |

FOREIGN PATENT DOCUMENTS

GB   1 597 370   9/1981

* cited by examiner

Primary Examiner—Euncha P. Cherry
(74) Attorney, Agent, or Firm—McDermott Will & Emery

(57) ABSTRACT

A polygon scanning system and method is provided wherein two or more light beams impinge at different incident angles on a polygon facet and are sequentially used for scanning the surface of a substrate as the polygon is rotated. Embodiments include a system comprising a polygon having a reflective facet, a rotation mechanism for rotating the polygon, and a light source for directing a plurality of light beams to impinge on the facet such that each light beam impinges on the facet at a different incident angle. Each light beam is reflected by the facet to scan a particular portion of a surface of a substrate during a respective time interval when the rotation mechanism is rotating the polygon. Each of the plurality of light beams is reflected onto the substrate surface using a respective portion of the facet surface, such that the sum of the respective portions of the facet surface used to reflect the light beams is a very large percentage of the total surface area. Thus, the system has a duty cycle of close to 100 percent as well as a high data rate.

33 Claims, 4 Drawing Sheets

MULTI-BEAM POLYGON SCANNING SYSTEM

FIELD OF THE INVENTION

The present invention relates to polygon optical scanning systems. The present invention has particular applicability in laser printing, printed circuit board inspection, wafer inspection, reticle pattern inspection, and photolithography.

BACKGROUND ART

In conventional polygon scanning systems, a beam of light, such as from a laser light source or a lamp, is directed to illuminate a spot on a reflective facet of a rotating polygon, which typically has many such reflective facets. The reflected light beam from the facet is typically passed through an optical system for magnification and/or focusing, and then impinges on the surface of an object, such as a semiconductor wafer coated with photoresist, or the printing drum of a laser printer. As the polygon rotates, the reflected light beam is scanned across the surface of the object.

The data rate that can be achieved with a conventional polygon scanning system is dependent upon, inter alia, the rotational velocity of the polygon, the number of facets of the polygon, and the "duty cycle" of the polygon. The duty cycle can be defined as the portion of the area of each facet that is used for scanning. The duty cycle is typically less than "1" for conventional systems, because scanning cannot be performed when the incident light beam is transitioning from illuminating a first facet to illuminating a second, adjacent facet, as a result of the rotation of the polygon. During such transistions, a portion of the beam is deflected in one direction (from the first facet) and another portion of the beam is deflected in another direction (from the second facet), thereby preventing scanning of the substrate surface by the beam.

Another factor affecting the data rate of polygon scanning systems is the number of reservable spots (also called "pixels") along a scan line, which can be expressed as the "scan angle" $\theta_{sl}$, or total angle that the facet reflects the light beam, divided by the angle of diffraction $\theta_d$ due to the finite diameter of the light beam:

number of spots on scan line=$\theta_{sl}/\theta_d$, where (1)

$\theta_{sl}$=4Π/number of facets, and (2)

$\theta_d$=wavelength of light beam/beam diameter. (3)

As the foregoing equations 1–3 suggest, two contradictory conditions exist in prior art polygon scanning systems. To enlarge the number of spots on a line for improved system performance, the diameter of the beam needs to be increased (thereby decreasing diffraction). However, increasing the beam diameter decreases the duty cycle, because more facet area overlaps when the beam is transitioning from one facet to another, thereby reducing efficiency. This inherent tradeoff limits the pixel rate that can be achieved in conventional systems.

Prior art attempts to increase pixel rate have had limited success, and have related to illumination methodology, such as modifying the beam incident angle, and the shape and/or number of facets. For example, the number of facets can be increased, but the result is a decreased duty cycle. Alternatively, beam diameter can be increased such that the spot covers the entire facet (known as "overfill"), but if a laser beam is made large enough to overfill a facet and have the proper intensity and uniformity, it typically has low optical efficiency, wasting a significant amount of energy. Still further, the length of the facets can be enlarged, resulting in a smaller number of facets, each facet scanning a larger angular range. However, this increase in $\theta_{sl}$ is of limited utility, since light reflected from the facets is typically directed through an optical system (i.e., lenses), and such systems do not have a large angular range, for example, about 10 degrees to 20 degrees.

There exists a need for a polygon scanning system having an increased duty cycle and data rate, thereby increasing efficiency and system throughput.

SUMMARY OF THE INVENTION

An aspect of the present invention is a polygon scanning system which maximizes data rate while increasing its duty cycle, thereby significantly improving the efficiency of the system.

According to the present invention, the foregoing and other aspects are achieved in part by a polygon scanning system comprising a polygon having a reflective facet, a rotation mechanism for rotating the polygon, and a light source for directing a plurality of light beams to impinge on the facet such that each light beam impinges on the facet at a different incident angle. Each light beam is reflected by the facet to scan a particular portion of a surface of a substrate during a respective time interval when the rotation mechanism is rotating the polygon. Each of the plurality of light beams is reflected onto the substrate surface using a respective portion of the facet surface, such that the sum of the respective portions of the facet surface used to reflect the light beams is a very large percentage of the total surface area. Thus, the system has a duty cycle of close to 100 percent as well as a high data rate.

Another aspect of the present invention is a method comprising rotating a polygon having a reflective facet; directing a first light beam to impinge on the facet at a first incident angle such that a first light beam is reflected by the facet to scan a first portion of a surface of a substrate during a first time interval while the polygon is rotating; and directing a second light beam to impinge on the facet at a second incident angle such that a second light beam is reflected by the facet to scan a second portion of the surface of the substrate during a second time interval subsequent to the first time interval while the polygon is rotating.

Additional aspects of the present invention will become readily apparent to those skilled in this art from the following detailed description and appended claims, wherein only the preferred embodiments of the present invention are shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The data rate of conventional polygon scanning systems is limited, because as the number of polygon facets and/or the diameter of the incident light beam is increased, the duty cycle (i.e., the system's efficiency) decreases. The present invention overcomes the limitations on the duty cycle and data rate stemming from this trade-off inherent in conventional polygon scanning systems.

According to the methodology of the present invention, two or more light beams impinge at different incident angles on a polygon facet and are sequentially used for scanning the surface of a substrate as the polygon is rotated. The multiple-beams-per-facet technique of the present invention enables an increase in the overall data rate (pixels/sec) by enabling an increase in the number of facets while compensating for the resultant reduced duty cycle. An optimized system according to the present invention is one wherein the number of incident beams m times the duty cycle $\mu$ of each beam is almost 1, so that the total scanning time is almost 100%.

Figure 1A:
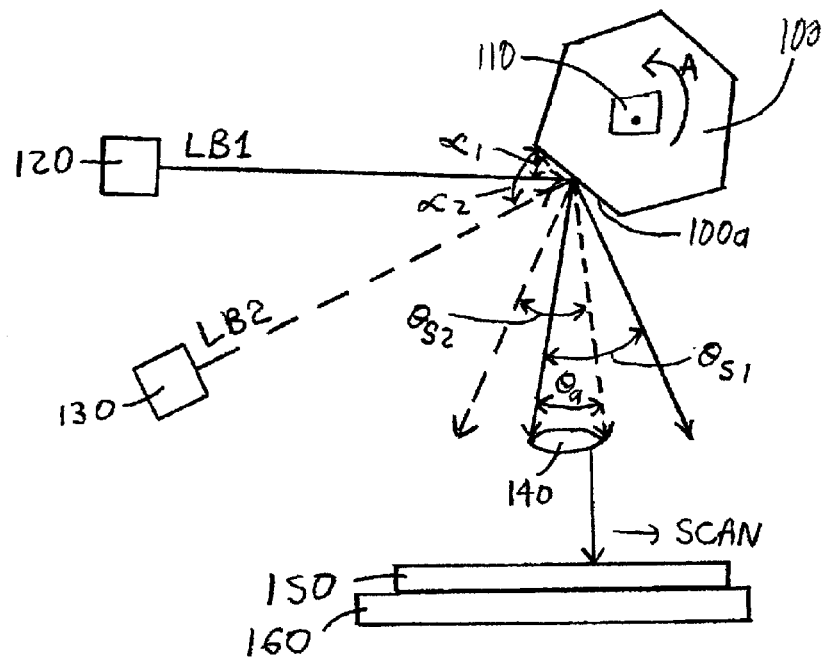
FIGS. 1a–1d schematically illustrate a polygon scanning system in accordance with an embodiment of the present invention.

An embodiment of the present invention will now be described with reference to FIGS. 1a to 1d. As shown in FIG. 1a, a polygon scanning system according to this embodiment of the present invention comprises a conventional polygon 100 having a plurality of facets, including facet 100a. Polygon 100 is rotated by a conventional rotation mechanism 110 in the direction of arrow A. Light sources 120, 130 generate light beams LB1 and LB2, respectively, and are arranged such that light beams LB1, LB2 impinge on facet 100a of polygon 100 at two different incident angles $\alpha_1$, $\alpha_2$, respectively, such as 15° and 22°. Light beam LB2 is shown in dashed lines for convenience. Light sources 120, 130 can be laser light sources each providing light of the same wavelength, or can each provide light of a different wavelength. Alternately, light sources 120, 130 can be lamps.

A conventional optical system 140 comprising one or more lenses is provided to focus and direct light beams LB1, LB2 to scan the surface of a substrate 150. Angle $_{s1}$ is the full angular range scanned by light beam LB1, and $_{s2}$ is the full angular range scanned by light beam LB2. However, each light beam is used for scanning substrate 150 only when it is within the angular range $_a$, which is conventionally referred to as the acceptance angle of optical system 140. A conventional movable stage 160 is provided for supporting substrate 150 and moving substrate 150 relative to polygon 100.

Figure 1B:
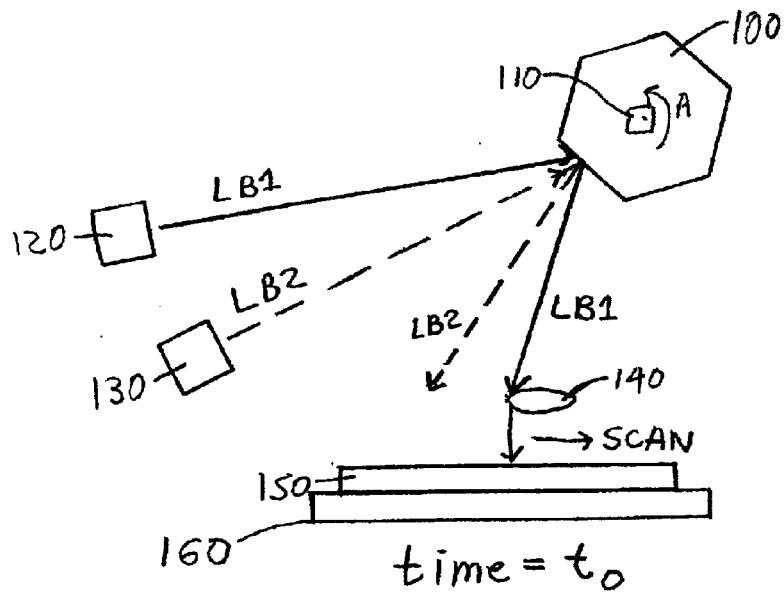
Figure 1C:
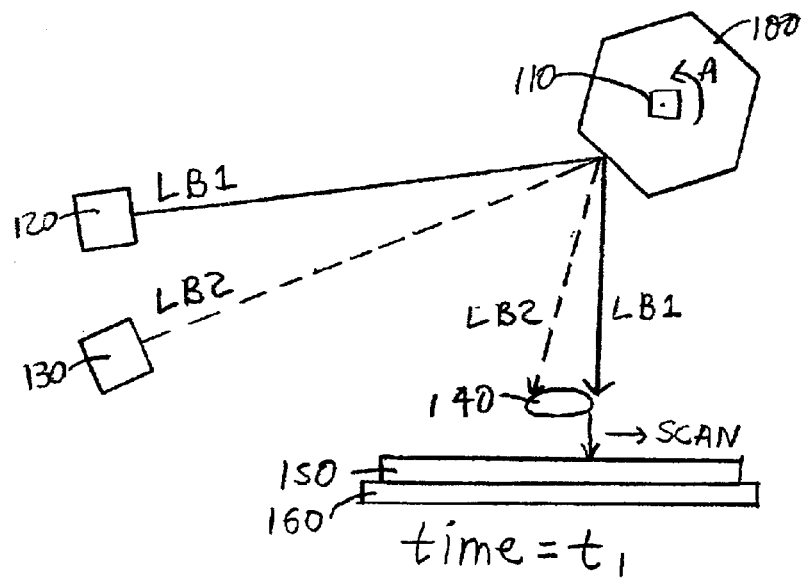
Figure 1D:
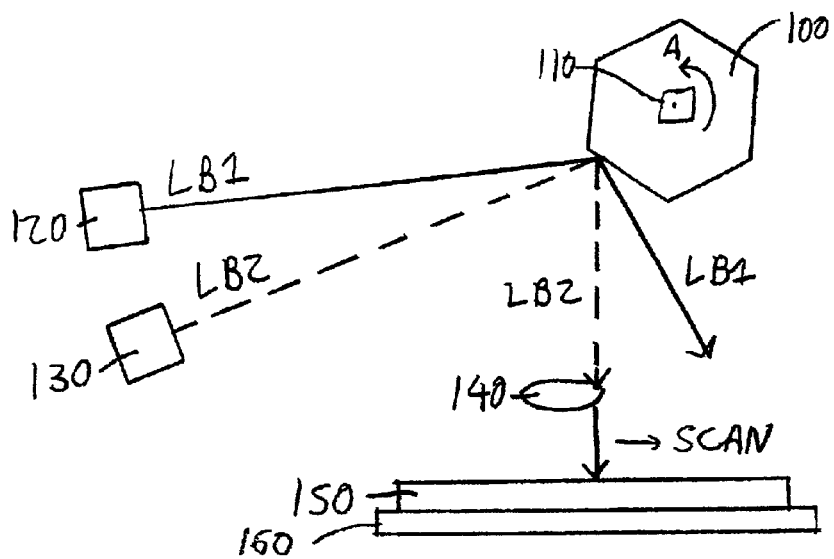

The operation of an embodiment of the present invention is illustrated at FIGS. 1b–1d. Referring now to FIG. 1b, at an initial time $t_0$, reflected light beam LB1 enters optical system 140 and scans a first portion of the surface of substrate 150 as polygon 100 rotates in the direction of arrow A. As shown in FIG. 1c, at time $t_1$ light beam LB1 has traversed acceptance angle $_a$, and is at the end of its useful scanning range. From time $t_0$ to time $t_1$, reflected light beam LB2 is not within the acceptance range, and is therefore irrelevant to the scanning operation. However, at time $t_1$, reflected light beam LB2 enters optical system 140 as reflected light beam LB1 leaves optical system 140 and, as shown in FIG. 1d, from time $t_1$ to time $t_2$ reflected light beam LB2 scans a second portion of the surface of substrate 150 as polygon 100 continues to rotate in the direction of arrow A. From time $t_1$ to $t_2$, reflected light beam LB1 is irrelevant to the scanning operation. The same process is repeated when the next facet of polygon 100 is in position opposite light sources 120, 130.

While polygon 100 is rotating, movable stage 150 can be used to move substrate 150 such that the first portion of the surface of substrate 150 scanned by LB1 is different from the second portion scanned by LB2. If substrate 150 is not moved by stage 160 relative to polygon 100, light beams LB1, LB2 will scan the same portion of the surface of substrate 150. In other words, the first portion and second portion of the surface of substrate 150 will be the same.

In further embodiments of the present invention, instead of two or more separate light sources, a single incident beam is split to provide the necessary number of beams to impinge on a polygon facet. There are two ways to split the incident beam that may be implemented in such a configuration: passive and dynamic spliting.

Figure 2:
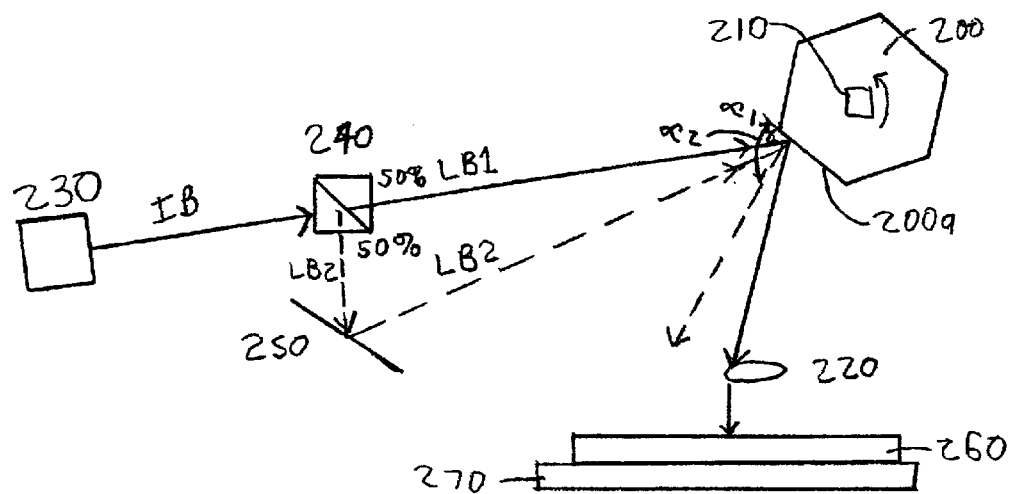
FIGS. 2–4 schematically illustrate polygon scanning systems according to further embodiments of the present invention.
Figure 3:
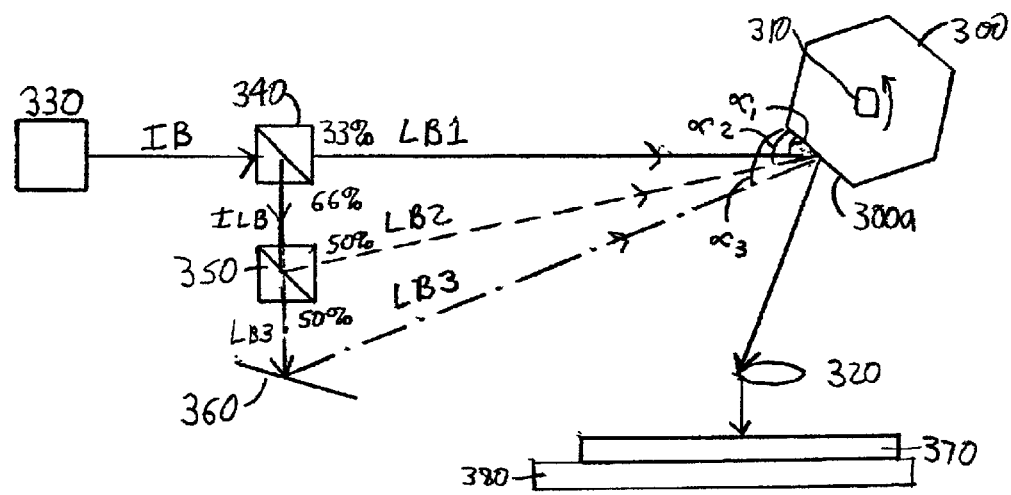

In the embodiment of the present invention illustrated in FIGS. 2 and 3, passive beam splitting is implemented by conventional beam splitters or diffraction gratings. Referring now to FIG. 2, a conventional polygon 200 having facet 200a, rotation mechanism 210 and optical system 220 are provided, as in the embodiment of FIGS. 1a–1d. A light source 230, such as a mode locked laser or CW laser, generates a single incident light beam IB, which is directed through a beam splitter 240. Beam splitter 240 can be a conventional cubic or plate beam splitter for splitting incident beam 1B such that 50% of the light passing through it forms light beam LB1, and 50% of the light forms light beam LB2. Light beam LB1 impinges directly on facet 200a at an incident angle $\alpha_1$, and light beam LB2 is reflected by a conventional mirror 250 to impinge on facet 200a at an incident angle $\alpha_2$. Alternatively, a conventional diffraction grating designed to diffract the appropriate number of orders with equal intensity (e.g., Damman gratings) may be used as beam splitter 240. Such diffration gratings are compact and inexpensive. The apparatus of FIG. 2 operates to scan the surface of substrate 260, which can be moved as desired during scanning relative to polygon 200 by movable stage 270, in the same manner as described above with reference to FIGS. 1b–d to scan successive portions of the surface of substrate 260.

Referring now to FIG. 3, in a further embodiment of the present invention, a conventional polygon 300 having facet 300a, rotation mechanism 310 and optical system 320 are provided, as in the embodiment of FIGS. 1a–1d. A light source 330, such as a mode locked laser or CW laser, generates a single incident light beam IB, which is directed through a first beam splitter 340. Beam splitter 340 can be a conventional cubic or plate beam splitter for splitting incident beam IB such that 33% of the light passing through it forms light beam LB1, and 66% of the light (shown as intermediate light beam ILB) is passed to a second beam splitter 350, which is also a conventional cubic or plate beam splitter. Second beam splitter 350 receives intermediate light beam ILB and splits it such that 50% of ILB forms light beam LB2, and 50% of ILB forms light beam LB3. Light beams LB1 and LB2 impinge directly on facet 300a at an incident angles $\alpha_1$, $\alpha_2$, respectively, and light beam LB3 is reflected by a conventional mirror 360 to impinge on facet 300a at an incident angle $\alpha_3$. Alternatively, conventional diffraction gratings designed to diffract the appropriate number of orders with equal intensity (e.g., Damman gratings) may be used as beam splitters 340, 350. Such diffration gratings are compact and inexpensive. The apparatus of FIG. 3 operates to scan the surface of substrate 370, supported and moved as desired relative to polygon 300 by movable stage 380, in the same manner as described above with reference to FIGS. 1b–d to scan successive portions of the surface of substrate 370.

Figure 4:
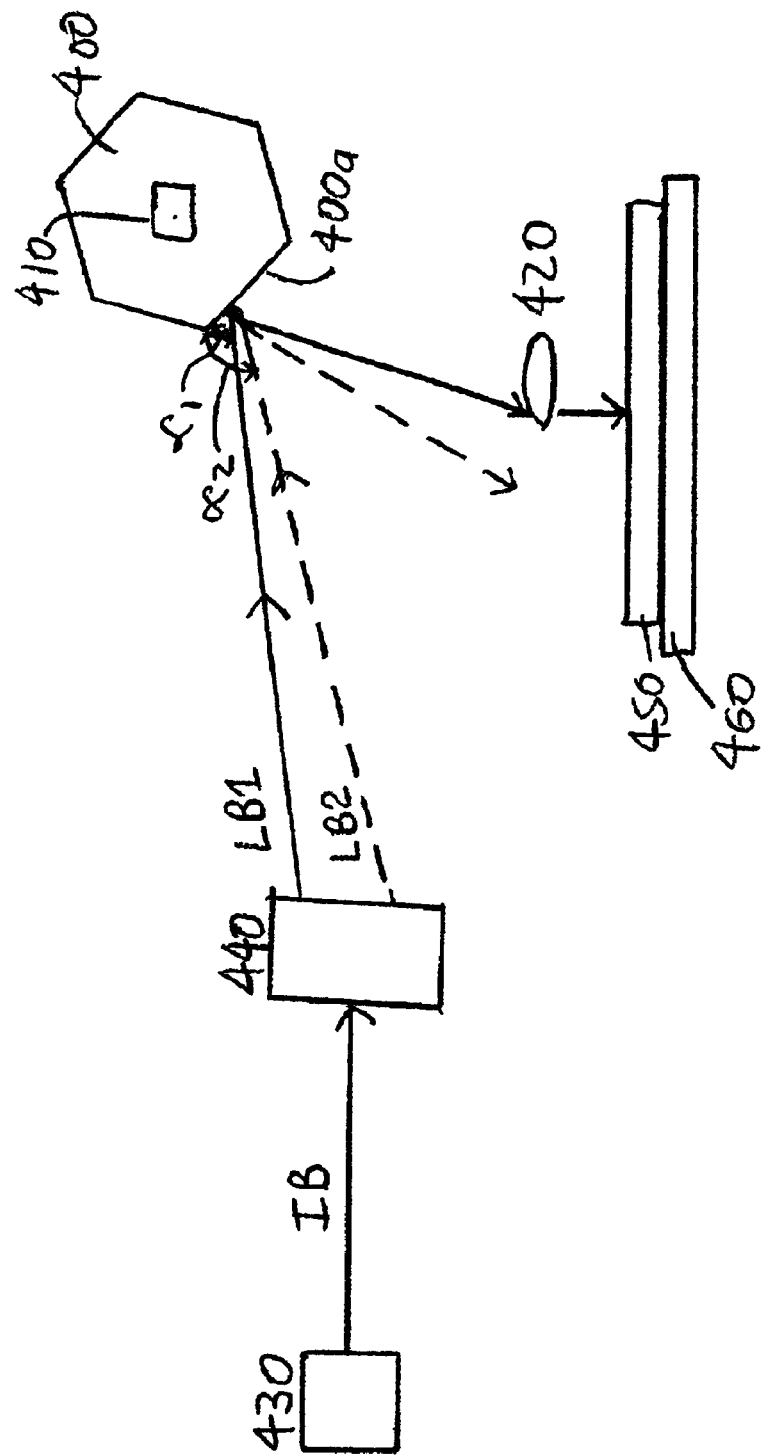

In the embodiment of the present invention illustrated in FIG. 4, active beam splitting is implemented by a conventional acousto-optical deflector ("AOD") that operates as a beam deflector. In a typical AOD, a piezoelectric resonator is provided for modulating pressure on a crystal to generate an acoustic wave in the crystal. The induced acoustic wave propagates within the crystal to create a grating having a particular index of refraction. When light, such as laser light from a light source of a scanning system of the present invention, is directed through the crystal, it is deflected according to the grating period. In this embodiment of the present invention, successively different modulation signals, such as sinusoidal radio frequency (RF) signals of different frequencies, are provided to the AOD to generate different gratings at different successive time periods (e.g., time intervals $t_0$ to $t_1$ and $t_1$ to $t_2$ discussed above). In this way, the AOD deflects the incident light towards the polygon such that it impinges on a facet at different angles during different time periods. This technique is practical because the time necessary for the AOD to change the deflection of a light beam used in practicing the present invention is negligible. For example, the velocity of an acoustic wave within an AOD is typically about 6000 m/sec, and the diameter of a light beam used in practicing the invention is typically about 1 mm. Thus, a change in deflection of the light beam is made during a period of 1 mm/(6000 m/sec), or 0.166 microseconds. Moreover, the AOD may be used to compensate for facet-to-facet reflectivity variance, by controlling the AOD's RF power.

Referring now to FIG. 4, a conventional polygon 400 having facet 400a, rotation mechanism 410 and optical system 420 are provided, as in the embodiment of FIGS. 1a–d. A light source 430, such as a mode locked laser or CW laser, generates a single incident light beam IB, which is directed through an AOD 440. AOD 440 deflects incident beam IB such that it forms light beam LB1 and light beam LB2 at above-discussed time intervals $t_0$ to $t_1$ and $t_1$ to $t_2$, respectively. Light beam LB1 impinges on facet 400a at an incident angle $\alpha_1$, and light beam LB2 impinges on facet 400a at an incident angle $\alpha_2$. The apparatus of FIG. 4 operates to scan the surface of substrate 450, which is supported and moved as desired by movable stage 460, in the same manner as described above with reference to FIGS. 1b–d to scan successive portions of the surface of substrate 450.

As one skilled in the art will appreciate, conventional beam splitting and/or AOD beam deflection techniques can be used to produce more than the two or three light beams described above with reference to FIGS. 3 and 4 from a single beam for practicing the present invention. The original light beam can be diffracted or deflected into N light beams to impinge on the polygon facet 300a, 400a at N incident angles such that the Nth light beam is reflected by the facet to scan an Nth portion of the surface of the substrate 370, 450 during an Nth time interval while polygon 300, 400 is rotating. Of course, movable stage 380, 460 can move substrate 370, 450 relative to polygon 300, 400 such that the N portions of the surface of substrate 370, 450 are different from each other.

Specific examples of polygon scanning systems according the present invention will now be provided to demonstrate the performance of the inventive systems, and to compare them to single-beam prior art systems. A brief summary of well-known performance parameters of polygon scanning systems precedes the examples.
Definitions:

$n_s$—Number of polygon facets.
D—Light beam spot diameter $(1/e^2)$.
R—Polygon radius (center to facet).
LL—Facet length.
$\epsilon$—Total facet margin.
$L=LL-\epsilon$—Effective facet length.
$\alpha$—Incident angle.
RPM—Revolutions per minute of polygon.
NL—Effective number of pixels per line.
$\tilde{\mu}$—Effective duty cycle.
$\mu$—Nominal duty cycle.
$\theta d$—Diffraction angle.
$\theta sl$—Nominal scan line angle.
$\theta_{sl}$—Effective scan angle.
$\theta o$—acceptable incident angle into the optical system
PR—Total effective pixel rate (Pixels/sec)

The diffraction angle due the finite light beam diameter is expressed as:

$$\theta_d = 2K\frac{\lambda}{D}$$

where K is the truncation coefficient.
The nominal scan angle is $$\theta_{sl} = 2\frac{2\pi}{n_s},$$

and the effective scan angle is $$\tilde{\theta}_{sl} = 2\frac{2\pi}{n_s}\tilde{\mu}.$$

The scan angle is further limited by the acceptance angle into the optical system, which in most cases is smaller than the scan angle. Thus, the effective duty cycle can be defined as $$\tilde{\mu} = \frac{\theta_o}{\theta_{sl}}.$$

The effective facet length is the geometrical facet length minus $\epsilon$, thus $$L = 2\mathrm{Tan}\left[\frac{\pi}{n_s}\right]r - \varepsilon$$

The nominal duty cycle $\mu$ is the relative effective area of the facet that can be used for scanning:

$$\mu = \frac{L - D/2\cos(\alpha + \tilde{\theta}_{sl}/4) - D/2\cos(\alpha - \tilde{\theta}_{sl}/4)}{L + \varepsilon}$$

For relatively small scanning angles $\theta_{sl}$ we may approximate $$\mu \cong \frac{L - D/\cos(\alpha)}{L + \varepsilon}$$

Usually $\mu \geq \tilde{\mu}$ in order to use the entire aperture of the optical system.

The number of pixels per line is:

$$NL \approx k\frac{\theta_o}{\theta_d} = k\frac{\theta_{sl}}{\theta_d}\tilde{\mu}$$

The average pixel rate PR is:

$$PR(\text{pixels/sec}) = n_s \frac{RPM}{60} NL$$

Examples of system parameters for two multi-beam polygon scanning systems according to the present invention, as well as a prior art single-beam system, are summarized in the table below. These parameters were calculated such that the beam diameter was optimized to obtain maximum average spot rate. The calculations were performed assuming an incident light beam wavelength of 500 nm.

| Rotation velocity (RPM) | Polygon Diameter (mm) | No. of facets | Beam diameter (mm) | Duty cycle (each beam) | No. of beams |
|---|---|---|---|---|---|
| 30000 | 100 | 40 | 4.2 | 0.32 | 3 |
| 30000 | 100 | 24 | 5.7 | 0.48 | 2 |
| 30000 | 100 | 18 | 7.5 | 0.5 | 1 |

| Rotation velocity (RPM) | Instantaneous spot rate (spots per second) assuming a duty cycle of 1 | Average spot rate (spots per second) with actual duty cycle | Beams Incident angle | Scan angle (deg) | No. of spots per line |
|---|---|---|---|---|---|
| 30000 | 55 | 54 | 18°, 15°, 12° | 6 | 874 |
| 30000 | 74 | 70 | 22°, 15° | 14 | 2930 |
| 30000 | 97 | 49 | 15° | 20 | 5440 |

For the prior art single-beam scanning system at the bottom line of the table, it can be observed that although the beam diameter is very large, resulting in a large instantaneous spot rate and spots per line, the duty cycle is only 50%, resulting in a relatively low average spot rate. This illustrates the trade-off which inherently limits the performance of prior art systems. In contrast, the duty cycles of the inventive systems are very close to 1 (3×0.32=0.96; 2×0.48= 0.96), enabling the inventive systems to take advantage of polygons of more facets, to produce significantly higher average spot rates than that of the prior art system. The inventive systems are vastly more efficient, and exhibit increased performance as a result.

The polygon scanning system of the present invention is applicable to many scanning systems. For example, it can be used in an inspection tool that employs a laser spot to scan a surface, such as a semiconductor wafer, a photolithographic reticle, or a printed circuit board, for detecting defects. The present invention can also be applied to writing systems, such as laser printers for printing on paper, photolithographic exposure systems, printed circuit board and reticle writing tools, etc.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A polygon scanning system comprising:
    a polygon having a reflective facet, the facet having a leading edge and a trailing edge;
    a rotation mechanism for rotating the polygon from the leading edge to the trailing edge of the facet once per revolution of the polygon;
    a first light source for directing a first light beam to impinge on an incident location on the facet at a first incident angle such that the first light beam is reflected by the facet to scan a first portion of a surface of a substrate during a first time interval when the rotation mechanism is rotating the polygon between the leading edge and the trailing edge of the facet during a first revolution of the polygon; and
    a second light source for directing a second light beam to impinge on the facet at substantially the incident location, at a second incident angle such that the second light beam is reflected by the facet to scan a second portion of the surface of the substrate during a second time interval subsequent to the first time interval when the rotation mechanism is rotating the polygon between the leading edge and the trailing edge of the facet during the first revolution of the polygon.

2. The system of claim 1, wherein the first and second light sources comprise a single light beam generator for generating an original light beam and a first beam splitter for splitting the original light beam into the first and second light beams.

3. The system of claim 2, comprising a mirror for directing the second light beam to impinge on the facet.

4. The system of claim 2, comprising a second beam splitter for splitting the original light beam into a third light beam to impinge on the facet at a third incident angle such that the third light beam is reflected by the facet to scan a third portion of the surface of the substrate during a third time interval subsequent to the second time interval when the rotation mechanism is rotating the polygon.

5. The system of claim 4, comprising a mirror for directing the third light beam to impinge on the facet.

6. The system of claim 1, wherein the first and second light sources comprise a single light beam generator for generating an original light beam and a diffraction grating for diffracting the original light beam into the first and second light beams.

7. The system of claim 6, wherein the diffraction grating is for diffracting the original light beam into N light beams, including the first and second light beams, to impinge on the facet at an Nth incident angle such that the Nth light beam is reflected by the facet to scan an Nth portion of the surface of the substrate during an Nth time interval when the rotation mechanism is rotating the polygon.

8. The system of claim 1, wherein the first and second light sources comprise a single light beam generator for generating an original light beam, and an acousto-optic deflector for deflecting the original light beam to impinge on the facet at the first and second incident angles at the first and second time intervals, respectively.

9. The system of claim 8, wherein the polygon comprises a plurality of facets, and wherein the acousto-optic deflector is for compensating for a reflectivity variance between the plurality of facets.

10. The system of claim 1, further comprising an optical system disposed between the facet and the substrate for focusing the first and second light beams.

11. The system of claim 1, wherein the first and second light sources provide laser light.

12. The system of claim 2, wherein the original light source is a laser light source.

13. The system of claim 11, wherein wherein the first light source is for providing laser light at a first wavelength, and the second light source is for providing laser light at a second wavelength different from the first wavelength.

14. The system of claim 1, wherein the first and second light sources are lamps.

15. A polygon scanning system comprising:
a polygon having a reflective facet;
a rotation mechanism for rotating the polygon; and
a light source for directing a plurality of light beams to impinge on the facet such that each light beam impinges on the facet at substantially the same incident location, at an incident angle different than the incident angles of the other light beams, and each light beam is reflected by the facet to scan a respective portion of a surface of a substrate during a respective time interval when the rotation mechanism is rotating the polygon;
wherein the facet has a total surface area, and each of the plurality of light beams is reflected onto the substrate surface using a respective portion of the facet surface;
wherein the sum of the respective portions of the facet surface used to reflect the light beams is greater than 90 percent of the total surface area.

16. A method comprising:
rotating a polygon having a reflective facet from a leading edge of the facet to a trailing edge of the facet once ner revolution of the polygon;
directing a first light beam to impinge on an incident location on the facet at a first incident angle such that a first light beam is reflected by the facet to scan a first portion of a surface of a substrate during a first time interval while the polygon is rotating between the leading edge and the trauma edge of the facet during a first revolution of the polygon; and
directing a second light beam to impinge on the facet at substantially the incident location, at a second incident angle such that a second light beam is reflected by the facet to scan a second portion of the surface of the substrate during a second time interval subsequent to the first time interval while the polygon is rotating between the leading edge and the trailing edge of the facet during the first revolution of the polygon.

17. The method of claim 16, comprising generating a single original light beam and splitting the original light beam into the first and second light beams.

18. The method of claim 17, comprising splitting the original light beam into a third light beam to impinge on the facet at a third incident angle such that the third light beam is reflected by the facet to scan a third portion of the surface of the substrate during a third time interval subsequent to the second time interval while the polygon is rotating.

19. The method of claim 16, comprising generating a single original light beam and diffracting the original light beam into the first and second light beams.

20. The method of claim 19, comprising diffracting the original light beam into N light beams, including the first and second light beams, to impinge on the facet at an Nth incident angle such that the Nth light beam is reflected by the facet to scan an Nth portion of the surface of the substrate during an Nth time interval while the polygon is rotating.

21. The method of claim 16, comprising focusing the first and second light beams between the facet and the substrate.

22. A method comprising:
rotating a polygon having a reflective facet; and
directing a plurality of light beams to impinge on the facet at substantially the same incident location, such that each light beam impinges on the facet at an incident angle different than the incident angles of the other light beams, and each light beam is reflected by the facet to scan a respective portion of a surface of a substrate during a respective time interval while the polygon is rotating;
wherein the facet has a total surface area, and each of the plurality of light beams is reflected onto the substrate surface using a respective portion of the facet surface;
wherein the sum of the respective portions of the facet surface used to reflect the light beams is greater than 90 percent of the total surface area.

23. The system of claim 1, wherein the first portion of the surface of the substrate is the same as the second portion of the surface of the substrate.

24. The system of claim 1, further comprising a movable stage for supporting the substrate and moving the substrate relative to the polygon.

25. The system of claim 24, wherein the stage is for moving the substrate such that the first portion of the surface of the substrate is different than the second portion of the surface of the substrate.

26. The system of claim 4, further comprising a movable stage for supporting the substrate and moving the substrate relative to the polygon such that the first, second and third portions of the surface of the substrate are different from each other.

27. The system of claim 7, further comprising a movable stage for supporting the substrate and moving the substrate relative to the polygon such that the N portions of the surface of the substrate are different from each other.

28. The system of claim 15, further comprising a movable stage for supporting the substrate and moving the substrate relative to the polygon such that the respective portions of the surface of the substrate are different from each other.

29. The method of claim 16, comprising moving the substrate such that the first portion of the surface of the substrate is different than the second portion of the surface of the substrate.

30. The method of claim 18, further comprising moving the substrate relative to the polygon such that the first, second and third portions of the surface of the substrate are different from each other.

31. The method of claim 20, further comprising moving the substrate relative to the polygon such that the N portions of the surface of the substrate are different from each other.

32. The method of claim 22, comprising moving the substrate relative to the polygon such that the respective portions of the surface of the substrate are different from each other.

33. The method of claim 16, comprising generating a single original light beam and deflecting the original light beam to impinge on the facet at the first and second incident angles at the first and second time intervals, respectively.

* * * * *